US009184798B2

(12) United States Patent
Royston

(10) Patent No.: US 9,184,798 B2
(45) Date of Patent: Nov. 10, 2015

(54) NEAR FIELD COMMUNICATIONS (NFC) DEVICE HAVING ADJUSTABLE GAIN

(75) Inventor: Philip Stewart Royston, Newbury (GB)

(73) Assignee: Broadcom Corporation, Irvine, CA (US)

(*) Notice: Subject to any disclaimer, the term of this patent is extended or adjusted under 35 U.S.C. 154(b) by 19 days.

(21) Appl. No.: 13/418,174

(22) Filed: Mar. 12, 2012

(65) Prior Publication Data

US 2013/0237150 A1    Sep. 12, 2013

(51) Int. Cl.
*H04B 5/00* (2006.01)
*H04W 52/04* (2009.01)

(52) U.S. Cl.
CPC .............. *H04B 5/0025* (2013.01); *H04W 52/04* (2013.01)

(58) Field of Classification Search
CPC ............................. H04B 5/0025; H04W 52/04
USPC .............. 455/41.1, 41.2, 77, 193.1; 340/10.1, 340/10.3; 330/254; 375/316, 327
See application file for complete search history.

(56) References Cited

U.S. PATENT DOCUMENTS

| 5,077,834 | A * | 12/1991 | Andros et al. ............. 455/193.1 |
| 2004/0120424 | A1 * | 6/2004 | Roberts ......................... 375/327 |
| 2008/0233871 | A1 * | 9/2008 | Rofougaran et al. ........ 455/41.2 |
| 2008/0266059 | A1 | 10/2008 | Murofushi et al. |
| 2009/0195360 | A1 | 8/2009 | Jeon et al. |
| 2009/0237218 | A1 * | 9/2009 | Kim ............................. 340/10.3 |
| 2010/0148929 | A1 * | 6/2010 | Wu et al. ...................... 340/10.1 |
| 2010/0237943 | A1 * | 9/2010 | Kim et al. ..................... 330/254 |
| 2010/0246561 | A1 | 9/2010 | Shin et al. |
| 2011/0034133 | A1 * | 2/2011 | Rofougaran et al. ........... 455/77 |
| 2011/0206160 | A1 * | 8/2011 | Sung et al. .................... 375/316 |
| 2012/0313758 | A1 * | 12/2012 | Savarese et al. ............. 340/10.1 |

FOREIGN PATENT DOCUMENTS

| EP | 1 884 880 A2 | 2/2008 |
| KR | 10-2007-0080934 A | 8/2007 |
| KR | 10-2009-0084291 A | 8/2009 |
| TW | 201127133 A1 | 8/2011 |
| WO | WO 2008/073181 A2 | 6/2008 |

OTHER PUBLICATIONS

Office Action directed to related Taiwanese Patent Application No. 101133033, mailed on Dec. 8, 2014; 7 pages.

(Continued)

*Primary Examiner* — Wesley Kim
*Assistant Examiner* — Raj Chakraborty
(74) *Attorney, Agent, or Firm* — Sterne, Kessler, Goldstein & Fox PLLC

(57) ABSTRACT

A near field communications (NFC) device is disclosed that is capable of optimizing a gain for received signals. Measurements are made of signals received from an NFC environment and are compared to one or more threshold hold values. Based on the comparison, it is determined whether the measurements indicate underamplification or overamplification. Depending on the results of the analysis, one or more components within the NFC device is adjusted to increase or decrease the gain, respectively. The measurements may be taken during an unloaded baseline state or during loading, and may be compared to previous measurements to estimate their accuracy.

20 Claims, 5 Drawing Sheets

(56) References Cited

OTHER PUBLICATIONS

English language abstract of KR 10-2007-0080934 A, Thomson Innovation, http://www.thomsoninnovation.com, accessed Jan. 16, 2014.
International Standard: ISO/IEC 21481, *Information technology—Telecommunications and information exchange between systems—Near Field Communication Interface and Protocol-2 (NFCIP-2)*, pp. 1-12, First edition, Reference number ISO/IEC 21481:2005(E), ISO/IEC (Jan. 2005).
International Standard: ISO/IEC 18092, *Information technology—Telecommunication and information exchange between systems—Near Field Communication—Interface and Protocol (NFCIP-1)*, pp. 1-66, First edition, Reference number ISO/IEC 18092:2004(E), ISO/IEC (Apr. 2004).
European Search Report for related European Patent Application EP 12005867.2, from the European Patent Office, The Hague, dated Jul. 15, 2015; 5 pages.

* cited by examiner

NEAR FIELD COMMUNICATIONS (NFC) DEVICE HAVING ADJUSTABLE GAIN

BACKGROUND

1. Field of Invention

The disclosure relates to near field communications (NFC), and more specifically to optimizing gain within an NFC capable device.

2. Related Art

Near field communication (NFC) devices are being integrated into communication devices, such as mobile devices to provide an example, to facilitate the use of these communication devices in conducting daily transactions. For example, instead of carrying numerous credit cards, the credit information provided by these credit cards could be stored onto an NFC device. The NFC device is simply tapped to a credit card terminal to relay the credit information to the terminal to complete a transaction. As another example, a ticket writing system, such as is used in a bus or train terminal, may simply write ticket fare information onto the NFC device instead of providing a ticket to a passenger. The passenger simply taps the NFC device to a reader to ride the bus or the train without the use of a paper ticket.

Generally, NFC requires that NFC devices be present within a relatively small distance from one another so that their corresponding magnetic fields can exchange information. Typically, a first NFC device transmits or generates a magnetic field modulated with the information, such as the credit information or the ticket fare information. This magnetic field inductively couples the information onto a second NFC device that is proximate to the first NFC device, which is received by an antenna of the second NFC device. The second NFC device may respond to the first NFC device by inductively coupling its corresponding information onto an antenna of the first NFC device.

Typically, to process the information received from the second NFC device, the first NFC device demodulates and decodes the received signal with a predetermined gain. In other words, NFC device receiver circuits have traditionally been designed to have a fixed gain. The fixed gain is meant to be a compromise between a maximum gain possible for a poorly-tuned antenna system aid a saturation gain that would saturate the receiver in a well-tuned antenna system.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 1:
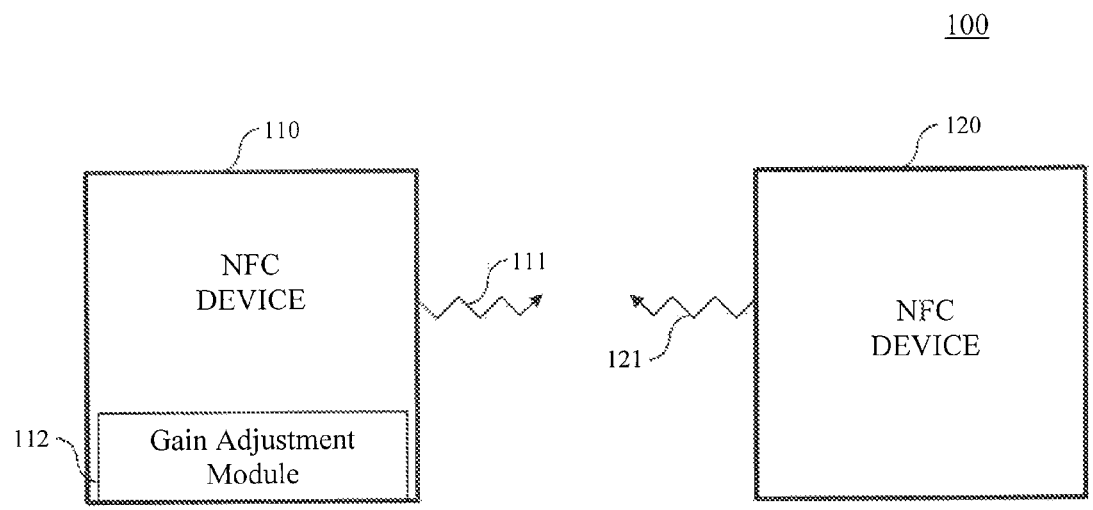
FIG. 1 illustrates a block diagram of an exemplary NFC environment.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the disclosure is defined only in accordance with the following claims and their equivalents.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc.

For purposes of this discussion, the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Although the description of the present disclosure is to be described in terms of near field communication (NFC), those skilled in the relevant art(s) will recognize that the present disclosure may be applicable to other communications that use the near field and/or the far field without departing from the spirit and scope of the present disclosure.

An Exemplary Near Field Communications (NFC) Environment

FIG. 1 illustrates a block diagram of an NFC environment according to an exemplary embodiment of the invention. An NFC environment 100 provides wireless communication of information, such as one or more commands and/or data, among a first NFC device 110 and a second NFC device 120 that are sufficiently proximate to each other. The first NFC device 110 and/or the second NFC device 120 may be implemented as a standalone or a discrete device or may be incorporated within or coupled to another electrical device or host device, such as a mobile telephone, a portable computing device, another computing device such as a personal digital assistant, a laptop, or a desktop computer, a computer peripheral such as a printer, a portable audio and/or video player, a payment system, a ticketing writing system such as a parking ticketing system, a bus ticketing system, a train ticketing system or an entrance ticketing system to provide some examples, or in a ticket reading system, a toy, a game, a poster, packaging, advertising material, a product inventory checking system and/or any other suitable electronic device that will be apparent to those skilled in the relevant art(s) without departing from the spirit and scope of the present disclosure.

The first NFC device 110 and the second NFC device 120 interact with each other to exchange the information in a peer (P2P) communication mode or a reader/writer (R/W) communication mode. In the P2P communication mode, the first NFC device 110 and the second NFC device 120 may be configured to operate according to an active communication mode and/or a passive communication mode. The first NFC device 110 modulates its corresponding information onto a first carrier wave, referred to as a modulated information communication, and generates a first magnetic field by applying the modulated information communication to a first antenna to provide a first information communication 111. The first NFC device 110 ceases to generate the first magnetic field after transferring its corresponding information to the second NFC device 120 in the active communication mode. Alternatively, in the passive communication mode, the first NFC device 110 continues to apply the first carrier wave without its corresponding information, referred to as an unmodulated information communication, to continue to provide the first information communication 111 once the information has been transferred to the second NFC device 120.

The first NFC device 110 is sufficiently proximate to the second NFC device 120 such that the first information communication 111 is inductively coupled onto a second antenna of the second NFC device 120. The second NFC device 120 demodulates the first information communication 111 to recover the information. The second NFC device 120 may respond to the information by modulating its corresponding information onto a second carrier wave and generating a second magnetic field by applying this modulated information communication to the second antenna to provide a second information communication 121 in the active communication mode. Alternatively, the second NFC device 120 may respond to the information by modulating the first carrier wave with its corresponding information to provide the second information communication 121 in the passive communication mode.

In the R/W communication mode, the first NFC device 110 is configured to operate in an initiator, or reader, mode of operation and the second NFC device 120 is configured to operate in a target, or tag, mode of operation. However, this example is not limiting. Those skilled in the relevant art(s) will recognize that the first NEC device 110 may be configured to operate in the tag mode and the second NFC device 120 may be configured to operate in the reader mode in accordance with the teachings herein without departing from the spirit and scope of the present disclosure. The first NFC device 110 modulates its corresponding information onto the first carrier wave and generates the first magnetic field by applying the modulated information communication to the first antenna to provide the first information communication 111. The first NFC device 110 continues to apply the first carrier wave without its corresponding information to continue to provide the first information communication 111 once the information has been transferred to the second NFC device 120. The first NFC device 110 is sufficiently proximate to the second NFC device 120 such that the first information communication 111 is inductively coupled onto the second antenna of the second NFC device 120.

The second NFC device 120 can derive or harvest power from the first information communication 111 to recover and/or process the received information, and/or to provide a response to the information. The second NFC device 120 demodulates the first information communication 111 to recover and/or to process the information. The second NFC device 120 may respond to the information by modulating the first carrier wave with its corresponding information to provide the second information communication 121.

Further operations of the first NFC device 110 and/or the second NFC device 120 may be described in International Standard ISO/IE 18092:2004(E), "Information Technology—Telecommunications and Information Exchange Between Systems—Near Field Communication—Interface and Protocol (NFCIP-1)," published on Apr. 1, 2004 and International Standard ISO/IE 21481:2005(E), "Information Technology—Telecommunications and Information Exchange Between Systems—Near Field Communication—Interface and Protocol-2 (NFCIP-2)," published on Jan. 15, 2005, each of which is incorporated by reference herein in its entirety.

NFC devices conventionally have a preset and fixed gain for amplifying received signals. This fixed gain is conventionally selected so as to amplify received signals to moderate levels, such that they are neither too small (which would be overly noisy) or too big (which would cause clipping and signal distortion). However, manufacturing variations and component tolerances with the NFC devices can change the maximum levels of various signals that can be provided to and/or delivered from the environment. As a result, signals amplified using the fixed gain can fall outside the acceptable level and into levels that are either too high or too low. Therefore, at least the first NFC device 110 includes a gain adjustment module 112 to analyze and, if necessary, adjust the gain within the first NFC device 110. Further details regarding the gain adjustment module 112 are discussed below.

An Exemplary NFC Device

Figure 2:
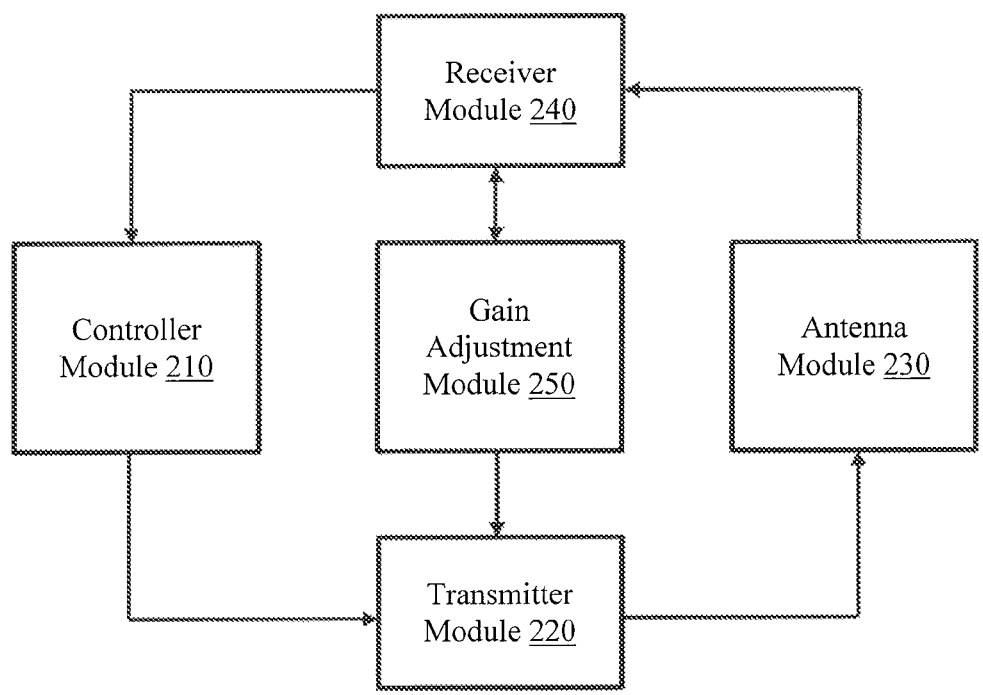
FIG. 2 illustrates a block diagram of a first exemplary NFC device that may be implemented within the NEC environment.

FIG. 2 illustrates a block diagram of a first exemplary NFC device that may be implemented within the NFC environment 100. The NFC device 200 includes a transmitter module 220, a receiver module 240, and a gain adjustment module 250, and may represent an exemplary embodiment of the first NFC device 110 and/or the second NFC device 120.

The NFC device 200 includes a controller 210 that controls overall operation and/or configuration of the NFC device 200. The controller 210 receives information from one or more data storage devices (not shown in FIG. 2), such as one or more contactless transponders, one or more contactless tags, one or more contactless smartcards, any other machine-readable mediums that will be apparent to those skilled in the relevant art(s) without departing from the spirit and scope of the present disclosure, or any combination thereof. The other machine-readable medium may include, but is not limited to, read only memory (ROM), random access memory (RAM), magnetic disk storage media, optical storage media, flash memory devices, electrical, optical, acoustical or other forms of propagated signals such as carrier waves, infrared signals, digital signals to provide some examples. The controller module 210 may also receive the information from a user interface (not shown), such as a touch-screen display, an alphanumeric keypad, a microphone, a mouse, a speaker, or any other suitable user interface that will be apparent to those skilled in the relevant art(s) without departing from the spirit and scope of the disclosure to provide some examples. The controller module 210 may further receive the information from other electrical devices or host devices coupled to the NFC device 200.

The controller 210 may perform various operations on the information before sending the information to the transmitter module 220. For example, the controller module 210 may format the received information into information frames and may perform error encoding, such as cyclic redundancy check (CRC) to provide an example, on the information. The information frames may include frame delimiters to indicate a start and/or an end of each of the information frames. The controller module 210 may additionally arrange multiple information frames to form sequences of information frames to synchronize and/or to calibrate the NFC device 200 and/or another NFC capable device. The sequences may include sequence delimiters to indicate a start and/or an end of each of the sequences.

Once the transmitter module 220 receives the information, from the controller module 210, the transmitter module 220 performs various operations on the signal to prepare the signal for transmission. Such operations may include encoding, filtering, amplifying, and modulating, for example, among others. The transmitter module 220 modulates the information onto a carrier wave, such as a radio frequency carrier wave having a frequency of approximately 13.56 MHz to provide an example, using any suitable analog or digital modulation technique to provide a modulated signal to the antenna module 230. Suitable analog or digital modulation techniques may include amplitude modulation (AM), frequency modulation (FM), phase modulation (PM), phase shift keying (PSK), frequency shift keying (FSK), amplitude shift keying (ASK), quadrature amplitude modulation (QAM) and/or any other suitable modulation technique that will be apparent to those skilled in the relevant art(s). The transmitter module 220 can also be characterized as attenuating the signal to prepare the signal for transmission by a transmission gain $G_{TX}$. The transmission gain $G_{TX}$ represents an adjustable gain that may be increased and/or decreased between different values. The transmission gain $G_{TX}$ can represent a positive gain or a negative gain.

The antenna module 230 applies the modulated signal to an inductive coupling element, such as a resonant tuned circuit to provide an example, to generate a magnetic field to transmit the information to the environment 100. Additionally, another NFC capable device may inductively couple a response signal onto the inductive coupling element. For example, this other NFC capable device may respond to the information by modulating its corresponding antenna with its corresponding information to modulate the carrier wave to provide the response signal to the antenna module 230. As another example, this other NFC capable device may modulate its corresponding information onto its corresponding carrier wave and generate its corresponding magnetic field by applying this modulated information communication to its corresponding antenna to provide the response signal to the antenna module 230.

The receiver module 240 performs various operations on the response signal so as to recover information contained within the response signal. Such operations may include mixing, filtering, demodulating, and decoding, for example, among others. The receiver module 240 then forwards the recovered information to the controller module 210 for further processing. The receiver module 240 can also be characterized as attenuating the response signal by a reception gain $G_{RX}$. The reception gain $G_{RX}$ represents an adjustable gain that may be increased and/or decreased between different values. The reception gain $G_{RX}$ can represent a positive gain or a negative gain. Together, a combination of the transmission gain $G_{TX}$ and the reception gain $G_{RX}$ can be referred to as an overall gain, or simply gain, of the NFC device 200.

Based on conditions and parameters of the components within the NFC device 200, the signal will be processed with some specific gain. The gain adjustment module 250 measures the received signal being processed by the receiver module 240, and performs an analysis of the measurement to make a determination as to whether the gain of the NFC device 200 is too high, too low, or satisfactory. If the gain adjustment module 250 deter-nines the gain to be satisfactory, the gain adjustment module 250 makes no adjustments to the NFC device 200. However, if the gain adjustment module 250 deter-nines that the gain is too high or too low, the gain adjustment module 250 adjusts one or more components in the receiver module 240 and/or the transmitter module 220 to bring the gain to an acceptable level, as detailed below. The transmitter gain is generally increased to maximize operational range. The transmitter gain is decreased when power savings are desirable.

Figure 3:
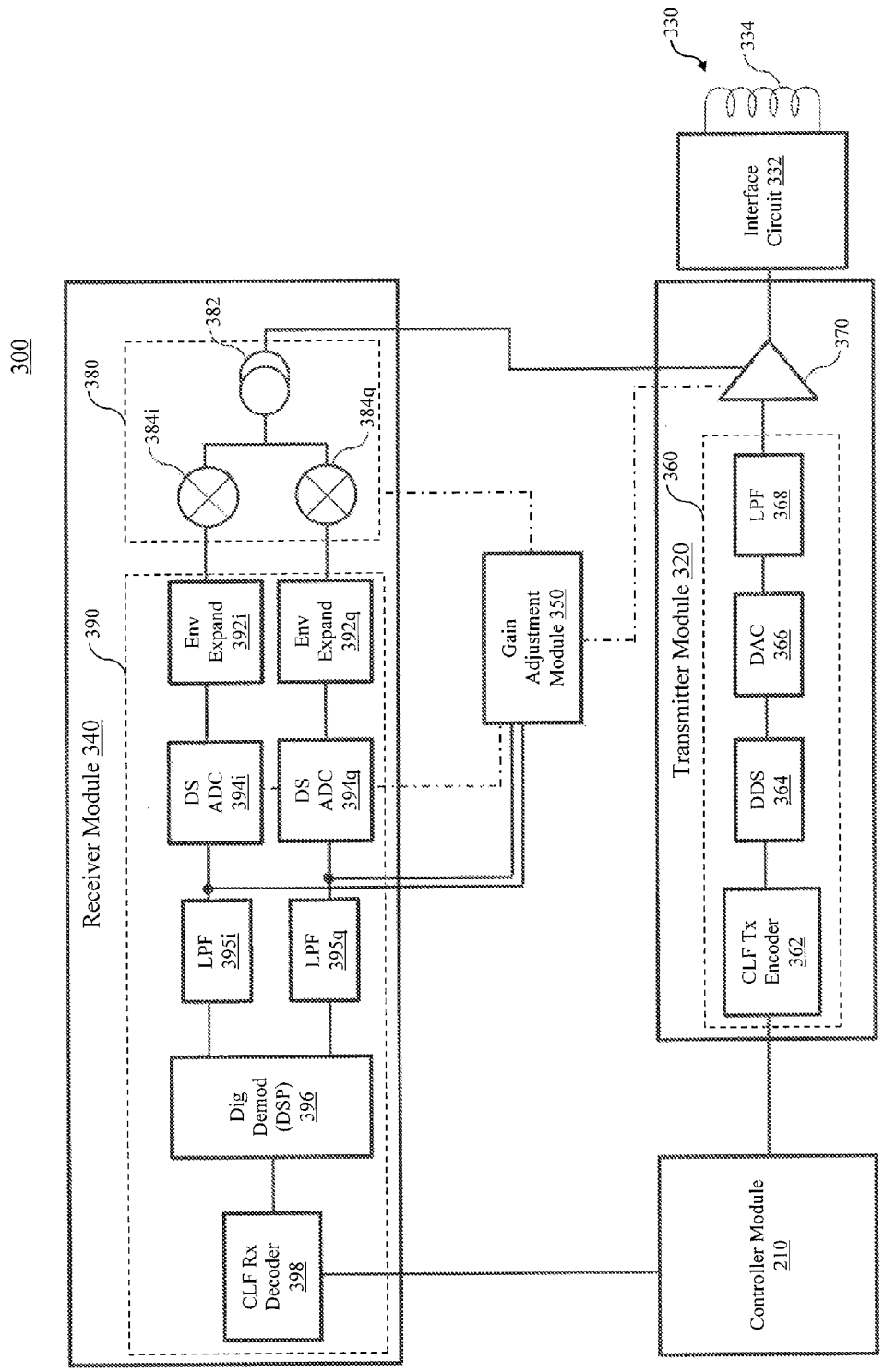
FIG. 3 illustrates a block diagram of a second exemplary NFC device that may be implemented within the NFC environment.

FIG. 3 illustrates a block diagram of a second exemplary NFC device 300 that may be implemented within the NFC environment 100. The NFC device 300 includes a transmitter module 320, a receiver module 340, and a gain adjustment module 350, and may represent an exemplary embodiment of the NFC device 200. The transmitter module 320 includes an encoder module 360 and an amplifier 370, and may represent an exemplary embodiment of the transmitter module 220. The receiver module 340 includes a signal detection module 380 and a decoder module 390, and may represent an exemplary embodiment of the receiver module 240. The NFC device 300 also includes an antenna module 330 that may represent an exemplary embodiment of the antenna module 230.

In the exemplary embodiment of FIG. 3, the transmitter module 320 and the receiver module 340 each include numerous components that together allow the NFC device 300 to send and receive signals, respectively. For example, information generated by the controller module 210 for transmission is sent to the encoder module 360 of the transmitter module 320. There, the signal passes through a CLF (Contactless Front End) transmission encoder 362, a DDS (direct digital synthesizer) 364, a DAC (digital-to-analog converter) 366, and an LPF (low-pass filter) 368, which encode, modulate, and otherwise prepare the signal for transmission. The encoder module 360 then forwards the signal to an amplifier 370 for amplification. The amplifier 370 may represent a low-noise amplifier, and may include a virtual earth mirror with adjustable gain.

Once the signal has been amplified, the signal is forwarded to the antenna module 330. The antenna module includes an interface circuit 332 coupled to an antenna element 334. The interface circuit 332 causes the signal to be loaded onto the antenna element 334 to communicate the signal to the NFC environment 100. In addition, the interface circuit also causes external signals that are loaded onto the antenna element 334 from the NFC environment 100 to be forwarded to the receiver module 340.

Received signals are detected within the signal detection module 380 of the receiver module 340. The signal detection module 380 includes a current sensor 382 that senses current through the virtual earth resulting from the loading of the antenna element 334. In this manner, the signal detection module 380 is capable of detecting the signals transmitted to the NFC device 300 from an external device, such as an external tag or other NFC device. The detected current may be supplied as a quadrature signal, having an in-phase component (I component) and a quadrature component (Q component), to an I-mixer 384$i$ and a Q-mixer 384$q$, respectively. The mixing may be performed to normalize the signals and/or to shift the signals to baseband.

Once mixed, the signal detection module 380 forwards the signals to the decoder module 390. In the decoder module 390, the I and Q components pass through, respectively, envelope expanders 392$i$ and 392$q$, DS ADCs (direct sampling analog-to-digital converters) 394$i$ and 394$q$, and LPFs 395$i$ and 395$q$. After the filtering, the signals are sent to a digital demodulator 396, where the quadrature components are recombined into a single signal. This signal is then decoded by a CLF receiver decoder 398 and forwarded to the controller module 210 for further processing.

Several of the components of the NFC device 300, such as the ADCs 394, the mixers 384, and the DAC 366 for example, may operate on an independent reference clock (not shown). In addition, any and all of the components of the NFC device 300 may be controllable by the controller module 210.

As discussed above, the gain adjustment module 350 measures received signals and adjusts the gain of the NFC device 300 to be within an allowable range based on the measurements. As shown in FIG. 3, the gain adjustment module 350 may acquire the received signals from the ADCs 394$i$ and 394$q$. Acquiring the signals from the ADCs 394 may be particularly beneficial because the ADCs 394 are often the primary source of saturation, clipping, and other signal distortions. Therefore, measuring the signals output from the ADCs 294 can provide a clear indication as to whether current gain settings are acceptable, or whether the gain should be adjusted.

After performing its analysis (detailed below), the gain adjustment module 350 may then adjust one or more of the components of the NFC device 300 to implement a new gain. This may be done by notifying the controller module 210 of the desired change, and carrying out the component adjustment with the controller module 210. Alternatively, as shown in FIG. 3, the gain adjustment module 350 can directly adjust various components to directly control gain settings. In the embodiment of FIG. 3, the gain adjustment module 350 is capable of adjusting operating parameters of the signal detection module 380, the ADCs 394$i$ and 394$q$, and the amplifier 370. For example, the gain adjustment module 350 may directly adjust the current sensor 382 in the signal detection module 380 or the Virtual Earth current mirror gain, which is part of the amplifier 370. It should be noted that the gain adjustment module 350 may adjust gain settings of the NFC device 300 by adjusting fewer, more, and/or different components than those shown in FIG. 3, depending on application.

Exemplary Gain Adjustment Module and Gain Adjustment Operation

Figure 4:
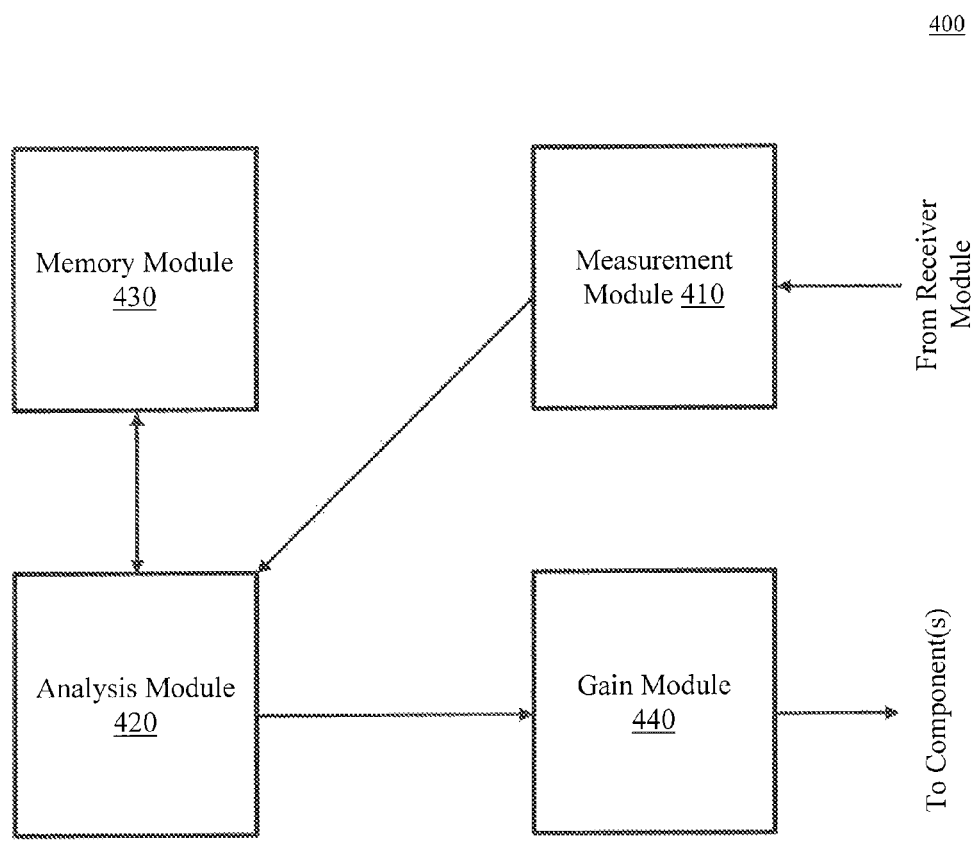
FIG. 4 illustrates a block diagram of an exemplary gain adjustment module that may be implemented within the first or the second NFC devices.

FIG. 4 illustrates a block diagram of an exemplary gain adjustment module 400. The gain adjustment module includes a measurement module 410, an analysis module 420, a memory module 430, and a gain module 440 and may represent an exemplary embodiment of the gain adjustment module 350. The adjustment operation performed by the gain adjustment module 400 will now be described with reference to FIGS. 3 and 4.

1. Baseline Adjusting

To begin the measurement process, the antenna module 330 turns on its field. Shortly after turning or the field, the signal detection module 380 forwards its detected signal to the measurement module 410 within the gain adjustment module 400. The time period between the antenna module 330 turning on its field, and the passage of the detected signal to the gain adjustment module 400 should be sufficiently short so as to prevent a tag or other NFC device from responding to the presence of the field. In this manner, the gain adjustment module 400 can analyze an unloaded baseline signal.

Once the measurement module 410 receives the detected signal, the measurement module 410 performs some measurement thereon. The measurement may include the mean, the total energy, the average power, the mean square, the instantaneous power, the root mean square, the variance, the norm, the voltage level and/or any other statistical measurement of detected signal which will be apparent to one skilled in the relevant art(s). It should be noted that measurements can be performed on the signal as a whole or on the I/Q components individually. For example, the measurement module 410 may measure a power or an amplitude of the received signal, or may measure $I^2$ and $Q^2$, individually. Once the measurement module 410 has measured the received signal, the measurement module 410 forwards the measurement to the analysis module 420.

The analysis module 420 analyzes the measurement to determine whether it falls within an acceptable range, and therefore determine whether the gain is at an acceptable level. In an embodiment, the analysis module 420 compares the measurement value to one or more threshold values to determine if the measurement value falls within the acceptable range.

In particular, a first predetermined threshold may be set based on minimum measurement required to produce a strong identifiable signal in the receiver module 340 when loaded. In addition, or as an alternative, a second predetermined threshold may be set based on the maximum measurement expected to avoid clipping when loaded with a received signal.

Together, the first predetermined threshold and the second predetermined threshold may be considered to form a measurement window.

If the analysis module 420 determines that the measurement is within the measurement window, then the analysis module 420 determines that the gain at an acceptable level and that no adjustments are necessary. Specifically, if the analysis module 420 determines that the measurement is above the first threshold and below the second threshold, then the analysis module determines that the gain at an acceptable level and that no adjustments are necessary. However, if the analysis module 420 determines the measurement to be below the first threshold, namely, outside of the measurement window, the analysis module instructs the gain module 440 to increase the gain. Accordingly, the gain module 440 adjusts one or more components of the NFC device 300 to increase the gain by some gain step. Likewise, if the analysis module 420 determines the measurement to be above the second threshold, namely, outside of the measurement window, the analysis module instructs the gain module 440 to decrease the gain. Accordingly, the gain module 440 adjusts one or more components of the NFC device 300 to reduce the gain by some gain step.

However, adjusting the gain once may be insufficient to place the baseline gain at an acceptable level. Therefore, shortly after the adjustments have been made, the measurement module 410 again acquires a received signal from the signal detection module 350, and the process repeats until the analysis module 420 determines the gain to be at an acceptable level.

To provide an example, a 15-bit ADC has a maximum positive swing output value of 16384 before it saturates. To obtain a viable signal, the baseline signal should have an $I^2$ and $Q^2$ values that are each at least 400. Therefore, the analysis module sets its first threshold to 400 and its second threshold to, for example, 12000 (to provide a safety margin between the baseline signal and the saturation point of the ADC), and the measurement module 410 measures the received signal by calculating $I^2$ and $Q^2$. If the analysis module 420 determines that one of the $I^2$ or $Q^2$ measurement to be below 400, the analysis module 420 instructs the gain module 440 to increase the gain until the $I^2$ and $Q^2$ measurement are both above 400. Likewise, if one of the $I^2$ or $Q^2$ measurements are above 12000, the analysis module 420 instructs the gain module 440 to decrease the gain until both the $I^2$ and $Q^2$ measurements are below 12000.

Once the analysis module 420 detects an acceptable baseline gain, the analysis module 420 may determine whether the baseline gain is truly absent of interferers, such as other NFC capable devices, other non-NFC capable devices, or other objects, such as metal objects, to provide some examples, within the field. Specifically, if there is an interferer in the field, the baseline gain may be artificially increased or decreased by the interferer. This means that the apparent acceptable baseline gain may actually fall out of the acceptable range when there are no interferers.

Consequently, the analysis module 420 accesses the memory module 430 to determine if a previously-measured baseline gain is stored therein. If there is no previous value, then the analysis module 420 assumes the current gain to be accurate and stores the baseline gain in the memory module 430. It may be preferred to measure and calculate the initial baseline gain at some manufacturing stage, to specifically ensure the absence of interferers.

If, on the other hand, there is a previously-stored gain in the memory module 430, the analysis module compares the current baseline gain to the previously-stored gain to provide evidence of the accuracy of the current baseline gain. For example, the presence of an interferer in the field will likely cause the calculated baseline gain to be higher than the previously-derived gain. Therefore, if the analysis module 420 determines the calculated baseline gain to be higher than the previous gain, the analysis module 420 instructs the gain module 440 to adjust the components of the NFC device 300 so as to implement the stored gain. This ensures that an acceptable gain (one that was measured absent interferers) is used.

If the analysis module 420 determines that the calculated baseline gain is less than the previous gain, the analysis module makes a further determination as to whether the calculated baseline gain is significantly less than the previous gain. This determination may be made, for example, by comparing the calculated baseline gain to some threshold value set based on the previous gain. For example, the analysis module 420 may determine the calculated baseline gain to be significantly less than the previous gain if the calculated baseline gain is less than some percentage of the previous gain (e.g., if $G_{BL} < G_P \times X$ %, where $G_{BL}$ is the calculated baseline gain and $G_P$ is the previous gain).

If the analysis module 420 determines the calculated baseline gain to be significantly less than the previous gain, the analysis module 420 assumes that an interferer is present and instructs the gain module 440 to employ the calculated baseline gain only for some period of time. This period of time is preferably such that, after the expiration of the period of time, the interferer is expected to be absent from the field. Once the period of time has expired, the analysis module 420 controls the gain module 440 to set the gain to the previous stored gain. By implementing the calculated baseline gain during the period of time, the NFC device can accurately process any signals received from the interferer without permanently adjusting its baseline parameters.

If, on the other hand, the analysis module 420 determines the calculated baseline gain not to be significantly less than the previous gain, the analysis module 420 determines the calculated baseline gain to be an accurate baseline gain (e.g., one without interferers). Consequently, the analysis module 420 causes the gain module 440 to employ the calculated baseline gain, and also stores the calculated baseline gain in the memory module 430 for future reference as the accurate gain value. This allows the NFC device 300 to repeatedly update its memory module 430 with more accurate baseline gain values.

The above describes how to optimize gain of the NFC device during normal operation of the NFC device. However, as discussed above, the gain may be measured in a manufacturing setting to ensure that no interferers are present. In this case, it may be unnecessary to take additional measurements. On the other hand, if the measurements are made during normal operation, it may be desirable to perform the measurements at regular intervals to ensure that the NFC device consistently maintains an accurate gain. In this case, it may also be desirable to repeatedly record the lowest gain settings to represent a gain absent interferers. Further, initial thresholds can be set based on calculations of worst case components and silicon tolerances to ensure accurate gain measurements. These thresholds can then be adjusted based on device performance. Those skilled in the relevant art(s) will recognize that many additional modifications may be made the NFC device 300 and gain adjustment module 400 without departing from the spirit and scope of the present disclosure.

2. Loaded Adjusting

In another exemplary embodiment, the analysis module 420 analyzes when it is confident that it is under load. This analysis can be performed in addition to, or instead of, the analysis discussed above with respect to an unloaded baseline signal, and can be used to achieve further optimized gain settings.

This configuration is substantially similar to the unloaded baseline signal configuration discussed above. For example, the antenna module 330 turns on its field and the signal in the receiver module 340 is supplied to the gain adjustment module 350 (400). The signal is measured by the measurement module 410 and analyzed by the analysis module 420 to determine if the measurement falls within an acceptable range. If it is not within the acceptable range, the gain module 440 adjusts one or more components within the NFC device 300 so as to increase (for a low measurement) or decrease (for a high measurement) the gain. Once an acceptable gain has been discovered, it is compared to a previously-stored gain stored in the memory module 430 to ensure its accuracy, as discussed above.

However, unlike the configuration of the previous embodiment, it is desired in the present embodiment that the measurement be based on a signal received from a tag or other NFC device. Described below are two exemplary configurations for ensuring that measurements are taken on such a signal. However, those skilled in the relevant art(s) will recognize that many additional or alternative configurations may also be available for achieving a substantially similar purpose within the spirit and scope of the present disclosure, Timed Measurement In a first configuration, the NFC device 300 ensures that the measurement is being made on a response signal by timing a response delay between the start of the polling and the receipt of the response signal, as detailed below.

First, the antenna module 330 turns on its field. Once the field has been turned on, the controller module 210 issues a polling instruction to the transmitter module 320. Upon receipt of the polling instruction, the transmitter module 320 prepares a polling signal, which it sends to the antenna module 330. Once received, the antenna module 330 initiates a first poll of the NFC environment 100.

Based on signals received in response to the first poll, the controller module 210 determines whether a tag or other NFC device exists in the NFC environment 100. Once the controller module 210 determines that a tag/device is present in the NFC environment 100, the controller module 210 initiates a second poll. Once again, the antenna module 330 initiates a poll of the NFC environment 100.

For this second poll, however, the NFC device 300 measures a response delay between the start of the poll and the receipt of the response signal from the tag/other device located in the NFC environment 100. This may be achieved by storing a first timestamp at the initiation of the second poll and comparing it to a timestamp of the received response signal. Alternatively, the NFC device 300 may start a counter at the initiation of the poll, and stop the counter when the response signal is received. This response delay is representative of a time at which a response signal will be expected to be in the receiver module 340.

Now that the NFC device 300 has measured the response delay, the controller module 210 initiates a third poll. Again, the antenna module 330 polls the NFC environment 100. At the same time, the NFC device tracks the elapsed time since the poll began. Once the elapsed time equals the response delay, the gain adjustment module 350 acquires the signal from the receiver module 340, which should include the response signal based of the timing.

It will be noted that, rather than comparing the elapsed time directly to the measured response delay, it may be beneficial to instead compare the elapsed time to a modified response delay. For example, the measured response delay represents the time at which a start of a response signal is received. Therefore, to account for minor fluctuations in receive time and/or further increase the likelihood of measuring a response signal, the measured response delay can be shortened or extended to generate a modified response delay that is more likely to expire during the receipt of a response signal. As one example, the measured response delay can be extended by a time equal to approximately half of a response signal duration so as to expire in the approximate mid-point of the received response signal.

The gain adjustment module 350 will acquire the response signal from the receiver module 340. Within the gain adjustment module 350 (gain adjustment module 400), the measurement module 410 measures the signal and provides the measurement to the analysis module 420. As before, the analysis module 420 compares the measurement to one or more predetermined thresholds to determine if the gain should be increased or decreased. However, because the signal being measured is a loaded response signal, rather than an unloaded baseline signal (as in the above embodiment), the threshold values should be different from the threshold values used for the baseline signal. Using the example of the 15-bit ADC, the lower positive threshold may be set to 8092 (equal to half the maximum output of the ADC) and the upper positive threshold may be set to 15000 (closer to the maximum output of the ADC).

As before, if the measurement falls outside of the one or more thresholds, the gain module 440 adjusts the gain accordingly. The method then repeats until an acceptable gain is discovered.

Repeat Measurement

In another configuration, rather than measure a response delay, the gain adjustment module 250 measures multiple signals and selects the measurement most likely to represent a response signal, as detailed below.

Once again, the controller module 210 initiates a poll of the NFC environment 100 and monitors the signals received by the receiver module 340 to ensure that a tag or other NFC device is located within the NFC environment 100 and is responding to the NFC device 300. Once the controller module 210 has determined that such a tag/device is present, the controller module 210 initiates a second poll, which the antenna module 330 performs.

Once the second poll begins, or shortly thereafter, the gain adjustment module 350 repeatedly acquires signals from the receiver module 340 at regular intervals over the course of some predetermined measurement period. The measurement period should be set to be sufficiently short so as to minimize computation, and sufficiently long so as to maximize the likelihood of overlapping with the response signal (accounting for response delay).

During the measurement interval, the gain adjustment module 350 (gain adjustment module 400) repeatedly receives signals from the receiver module 240. The measurement module 410 measures each of these signals and forwards them to the analysis module 420. The analysis module 420 then analyzes the received measurements to determine which most likely corresponds to a response signal.

One example of how to determine which of the measurements corresponds to a response signal is to determine the maximum from among the measurements. The response signal should have a much larger amplitude, power, etc. than other non-response signals (e.g., noise). Therefore, the maximum measurement likely corresponds to the response signal. The maximum may be determined after the measurement interval by storing each measurement and then comparing the measurements to each other. The maximum may also be determined during the measurement interval by initially storing a first measurement of the current measurement interval, and thereafter only replacing the stored measurement with a most recent measurement if the most recent measurement is larger than the previously-stored measurement of the same interval.

Once the maximum measurement has been determined for the current measurement interval, the analysis module 420 determines whether the measurement falls within the acceptable range by comparing it to the one or more threshold values. As above, if the measurement falls below the first threshold, the gain module 440 increases the gain, and if the measurement is above the second threshold, the gain module 440 decreases the gain. The process then repeats at the new gain settings until the maximum measurement for a given measurement interval falls within the acceptable range.

An Exemplary Method of Optimizing Gain within an NFC Device

Figure 5:
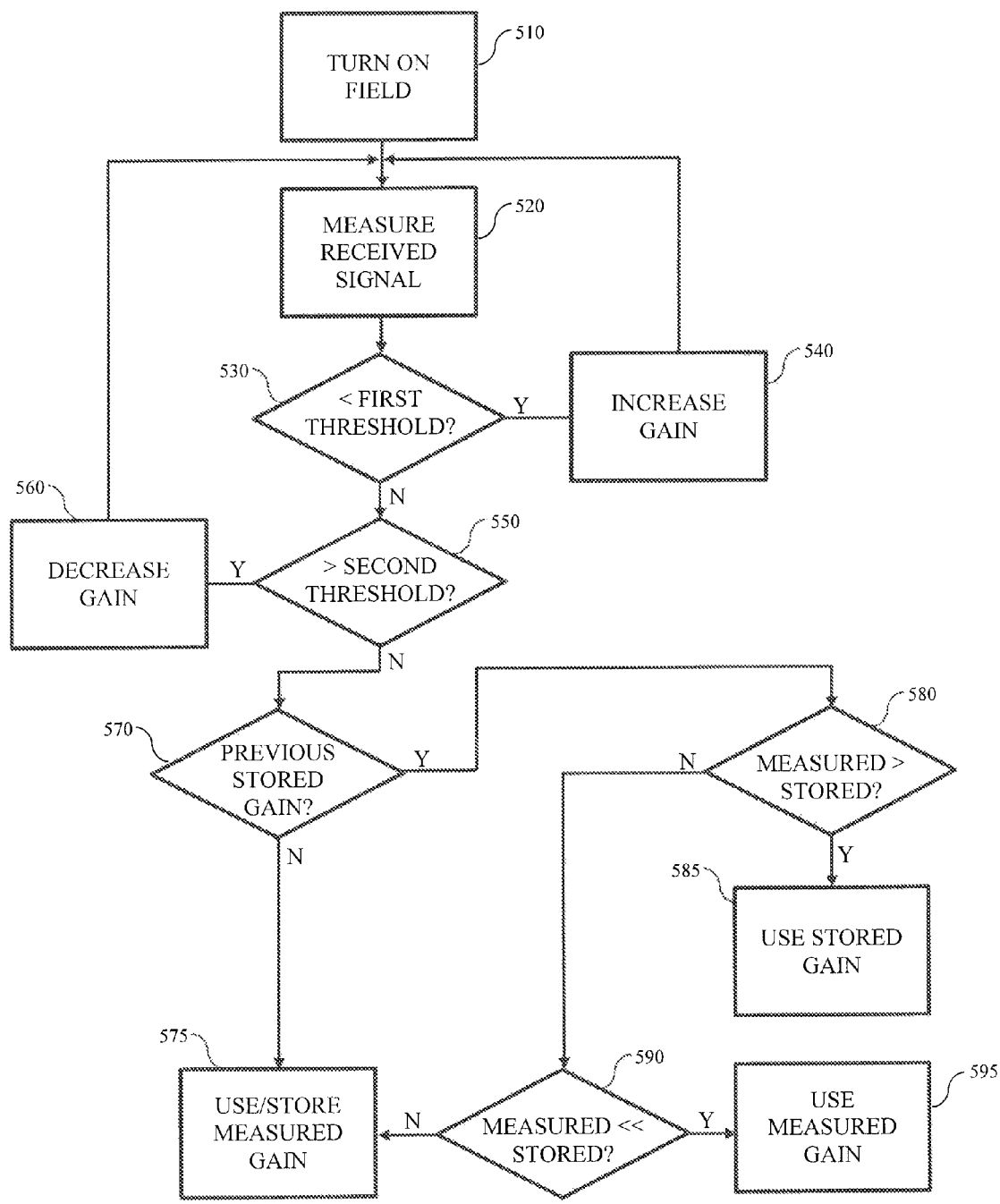
FIG. 5 illustrates a flowchart of an exemplary method for optimizing gain within an NFC device.

FIG. 5 illustrates a flowchart diagram of an exemplary method for optimizing gain within an NEC device.

First the NFC device turns on its field (510). After the field has been turned on the NFC device measures a received signal (520). The measurement can be performed on a signal received prior to, or during, the time at which a response signal from an external tag or device would be expected.

After the measurement has been performed, the NFC device compares the measurement to a first threshold value (530). The first threshold value may be set to represent a minimum or average value expected to produce a identifiable, but non-saturating, signal. If the measurement is below the first threshold (Y, 530), the NFC device adjusts one or more of its components to increase its gain (540). The method then repeats the measuring (520), comparing (530), and increasing (540) steps until the measurement exceeds the first threshold value (N, 530).

Once the measurement exceeds the first threshold value, the NFC device compares the measurement to a second threshold value (550). The second threshold value may be set to represent a maximum value expected to avoid clipping or other saturation within the NFC device. If the measurement is above the second threshold (Y, 550), the NFC device adjusts one or more of its components to reduce its gain (560). The measuring (520), comparing (530 and 550), and decreasing (560) steps repeat until the measurement is below the second threshold value (N, 550). This represents that the measurement falls within an acceptable range, and that the corresponding gain is acceptable.

Once the measurement is found to be within the acceptable range (N, 550), the NFC device determines if previous gain settings have been stored in memory (570). If no previous gain setting exists in the memory (N, 570), the NFC device saves the derived gain settings in the memory and proceeds to utilize these gain settings for future signals (575).

Alternatively, if there are previous gain settings stored in the memory (Y, 570), the NFC device compares the current derived gain settings to those previously stored (580). If the current derived gain is larger than the previously-stored gain (Y, 580), the NFC device does not store the current gain settings and also adjusts one or more of its components so as to implement the previously-stored gain settings (585). In this manner, the NFC device can identify the current derived gain as being based on a possible interferer, and prevent inaccurate gain settings from being saved and implemented.

If on the other hand, the derived gain is less than the previously-stored gain (N, 580), the NFC device determines whether the derived gain is significantly less than the previous gain (590). If the derived gain is significantly less than the previous stored gain (Y, 590), the NFC device does not store the current derived gain, but still uses the gain at least temporarily (595). For example, the NFC device may employ the derived gain settings only long enough to expect any interferers to be removed from the environment. If, however, the gain is determined to be significantly less than the stored gain (N, 590), the NFC device stores and uses the derived gain. Herein, "significantly less" may be defined based on particular system parameters on which this method is to be run, and may differ between devices. For example, the derived gain may be "significantly less" than a stored gain if it is 30% less on one device, or 42% on another device.

Those skilled in the relevant art(s) will recognize that the method can additionally or alternatively include any of the functionality of the NFC devices 200 and 300 discussed above, and the above description of the exemplary method should neither be construed to limit the method nor the description of the NFC devices 200 and 300.

CONCLUSION

It is to be appreciated that the Detailed Description section, and not the Abstract section, is intended to be used to interpret the claims. The Abstract section may set forth one or more, but not all exemplary embodiments, of the invention, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the disclosure should not be limited by any of the above-described exemplary embodiments, but should be defined only in accordance with the following claims and their equivalents.

What is claimed is:

1. A near-field communication (NFC) device that operates within an NFC environment, the NFC device comprising:
   a transmitter module, including an amplifier, configured to turn on a magnetic field to transmit a transmission signal to the NFC environment;
   a receiver module configured to receive a signal from the NFC environment in response to the magnetic field, the receiver module including:
   a signal detection module configured to detect the received signal within a predetermined time from the turning on of the magnetic field of the transmitter module;
   a decoder module configured to decode the received signal; and
   a gain adjustment module configured to:
   measure the received signal to produce a measurement;
   compare the measurement to a first threshold value and a second threshold value; and
   adjust a component of the amplifier, the signal detection module, or the decoder module when the measurement is not between the first threshold value and the second threshold value, wherein the predetermined time is sufficiently short so as to prevent a second NFC device within the NFC environment from responding to the transmission signal.

2. The NFC device of claim 1, wherein the receiver module comprises:
an analog-to-digital converter, and
wherein the gain adjustment module is configured to measure the received signal output from the analog-to-digital converter.

3. The NFC device of claim 2, wherein the signal detection module is configured to output the received signal to the decoder module as a quadrature signal having an in-phase component and a quadrature component,
wherein the analog-to-digital converter includes a first analog-to-digital converter configured to convert and to output the in-phase component of the received signal and a second analog-to-digital converter configured to convert and to output the quadrature component of the received signal, and
wherein the gain adjustment module is configured to individually measure and analyze the in-phase component output from the first analog-to-digital converter and the quadrature component output from the second analog-to-digital converter.

4. The NFC device of claim 3, wherein the gain adjustment module is configured to square the in-phase component of the received signal and square the quadrature component of the received signal to measure the received signal.

5. The NFC device of claim 4, wherein the first threshold value is a low threshold and the second threshold value is a high threshold.

6. The NFC device of claim 5,
wherein the gain adjustment module is configured to, if the measurement is below the first threshold value, control the component so as to increase a gain, and
wherein the gain adjustment module is configured to, if the measurement is above the second threshold value, control the component so as to decrease the gain.

7. The NFC device of claim 6, wherein the first threshold value and the second threshold value are set based on a maximum output level of the analog-to-digital converter.

8. A method for adjusting gain within a near-field communication (NFC) device that communicates within an NFC environment, the method comprising:
turning on a communication field to provide the communication field to the NFC environment;
receiving a signal from the NFC environment responsive to the communication field within a predetermined time from the turning on of the communication field;
measuring the received signal to produce a measurement;
analyzing the measurement by comparing the measurement to a first threshold and a second threshold; and
adjusting a component within the NFC device when the measurement is not between the first threshold and the second threshold,
wherein the predetermined time is sufficiently short so as to prevent a second NFC device within the NFC environment from responding to the turning on of the communication field.

9. The method of claim 8, further comprising:
determining that a present gain of the NFC device is acceptable;
determining if there exists a previously-stored gain in memory; and
if there is no previously-stored gain in the memory, storing the present gain in the memory.

10. The method of claim 9, further comprising:
if there is the previously-stored gain in the memory:
comparing the present gain to the previously-stored gain; and
if the present gain is larger than the previously-stored gain, controlling the component so as to implement the stored gain.

11. The method of claim 8, further comprising:
measuring the received signal at regular intervals during the predetermined time following the turning on of the communication field to acquire a plurality of measurements;
determining a maximum measurement from among the plurality of measurements; and
performing the analysis on the maximum measurement.

12. The method of claim 8, further comprising:
first polling the NFC environment to determine an amount of response delay time necessary for the second NFC device to load the received signal;
second polling the NFC environment;
during the second polling, tracking an amount of elapsed time; and
performing the measurement of the received signal when the elapsed time is approximately equal to the response delay time.

13. A near-field communication (NFC) device that communicates within an NFC environment, comprising:
a transmitter module being characterized by a transmission gain and configured to turn on a magnetic field and provide the magnetic field to the NFC environment;
a receiver module being characterized by a reception gain, and configured to receive a signal from the NFC environment within a predetermined time from the turning on of the magnetic field; and
a gain adjustment module configured to:
measure the received signal to produce a measurement
determine whether the measurement is within a measurement window defined by a first threshold and a second threshold; and
adjust at least one of the transmission gain and the reception gain such that the measurement is within the measurement window,
wherein the predetermined time extends from the turning on of the magnetic field to before a responding device interferes with the received signal.

14. The NFC device of claim 13, wherein the gain adjustment module includes:
a measurement module configured to measure the received signal; and
an analysis module configured to analyze the measurement to determine whether the measurement of the received signal is within the measurement window.

15. The NFC device of claim 14, wherein the first threshold is a lower threshold and the second threshold is an upper threshold, and
wherein the analysis module is configured to compare the measurement to the lower threshold and the upper threshold to analyze the measurement, the lower threshold and the upper threshold each being set based on performance capabilities of at least one component from among the transmitter module or the receiver module.

16. The NFC device of claim 15, further comprising:
a gain module configured to adjust at least one of the transmission gain and the reception gain so as to set a new gain for the NFC device,
wherein, if the measurement is below the lower threshold, the gain module is configured to adjust the at least one of the transmission gain and the reception gain so as to set the new gain for the NFC device to be larger than a previous gain, and wherein, if the measurement is above the upper threshold, the gain module is configured to adjust at least one of the transmission gain and the reception gain so as to set the new gain for the NFC device to be less than the previous gain.

17. The NFC device of claim 14, wherein the gain adjustment module further includes a memory module configured to store a previous gain setting of the NFC device, wherein, if the analysis module determines the measurement to be within the measurement window, the analysis module is configured to compare at least one of the transmission gain and the reception gain to at least one previous transmission gain and reception gain stored in the memory module.

18. The NFC device of claim 17, wherein if the analysis module determines the at least one of the transmission gain and the reception gain to be smaller than the at least one previous transmission gain and reception gain stored in the memory module, the analysis module is configured to store the at least one of the transmission gain and the reception gain in the memory module so as to overwrite the previous gain setting.

19. The NFC device of claim 13, wherein the gain adjustment module is configured to measure the received signal within a time period between a turning on of a radio and a minimum time at which a second NFC device within the NFC environment is able to respond to the turning on of the radio.

20. The NFC device of claim 1, wherein the gain adjustment module is configured to adjust the component of the amplifier, the signal detection module, or the decoder module such that the measurement is within a measurement window.

* * * * *